(12) United States Patent
Park

(10) Patent No.: US 10,170,510 B2
(45) Date of Patent: Jan. 1, 2019

(54) COLOR SEPARATION ELEMENT ARRAY, IMAGE SENSOR INCLUDING THE SAME, AND ELECTRONIC DEVICE

(71) Applicant: SAMSUNG ELECTRONICS CO., LTD., Suwon-si (KR)

(72) Inventor: Hongkyu Park, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 15/363,653

(22) Filed: Nov. 29, 2016

(65) Prior Publication Data

US 2017/0179178 A1    Jun. 22, 2017

(30) Foreign Application Priority Data

Dec. 22, 2015 (KR) .................. 10-2015-0184006

(51) Int. Cl.
| | | |
|---|---|---|
| H01L 31/00 | (2006.01) | |
| H01L 27/146 | (2006.01) | |
| H01L 31/0216 | (2014.01) | |
| G02B 27/10 | (2006.01) | |

(52) U.S. Cl.
CPC .... H01L 27/14625 (2013.01); G02B 27/1013 (2013.01); H01L 27/14621 (2013.01); H01L 27/14645 (2013.01); H01L 31/02162 (2013.01); H01L 31/02165 (2013.01); H01L 27/14627 (2013.01)

(58) Field of Classification Search
CPC ......... H01L 27/14621; H01L 27/14625; H01L 27/14645; H01L 31/02162; H01L 31/02165

USPC .................................. 257/294, 432, 440
See application file for complete search history.

(56) References Cited

U.S. PATENT DOCUMENTS

| | | | |
|---|---|---|---|
| 8,076,745 B2 | 12/2011 | Nishiwaki | |
| 8,767,114 B2 | 7/2014 | Hiramoto et al. | |
| 2010/0230583 A1* | 9/2010 | Nakata | H01L 27/14621 250/227.2 |
| 2014/0124650 A1 | 5/2014 | Nakamura et al. | |
| 2014/0151533 A1 | 6/2014 | Watanabe et al. | |
| 2015/0286060 A1 | 10/2015 | Roh et al. | |
| 2015/0323800 A1 | 11/2015 | Nam et al. | |
| 2015/0365640 A1 | 12/2015 | Park et al. | |
| 2016/0054172 A1 | 2/2016 | Roh et al. | |

(Continued)

FOREIGN PATENT DOCUMENTS

| | | |
|---|---|---|
| EP | 2 955 551 A1 | 12/2015 |
| JP | 2010-232595 A | 10/2010 |

(Continued)

*Primary Examiner* — Matthew E Warren
(74) *Attorney, Agent, or Firm* — Sughrue Mion, PLLC

(57) ABSTRACT

A color separation element array, an image sensor including the color separation element array, and an electronic device including the color separation element array are provided. The color separation element array includes a plurality of color separation elements configured to separate an incident light into a color light according to wavelength bands in a transparent layer, the plurality of color separation elements including a first element and a second element having different refractive indices, and the first element and second element being arranged in a horizontal direction.

12 Claims, 11 Drawing Sheets

(56) References Cited

U.S. PATENT DOCUMENTS

| | | | |
|---|---|---|---|
| 2016/0064448 A1* | 3/2016 | Shin | ................ H01L 27/14645 |
| | | | 257/292 |
| 2016/0133349 A1 | 5/2016 | Cho et al. | |
| 2016/0172390 A1 | 6/2016 | Numata | |
| 2017/0092676 A1* | 3/2017 | Yun | ................ H01L 27/14621 |

FOREIGN PATENT DOCUMENTS

| | | |
|---|---|---|
| JP | 2012-49620 A | 3/2012 |
| JP | 2015-32610 A | 2/2015 |
| KR | 10-2010-0047862 A | 5/2010 |
| KR | 10-2015-0143148 A | 12/2015 |
| KR | 10-2016-0023486 A | 3/2016 |

* cited by examiner

COLOR SEPARATION ELEMENT ARRAY, IMAGE SENSOR INCLUDING THE SAME, AND ELECTRONIC DEVICE

CROSS-REFERENCE TO RELATED APPLICATION

This application claims priority from Korean Patent Application No. 10-2015-0184006, filed on Dec. 22, 2015 in the Korean Intellectual Property Office, the disclosure of which is incorporated herein in its entirety by reference.

BACKGROUND

1. Field

Apparatuses and methods consistent with exemplary embodiments relate to a color separation element array having high color separation efficiency, an image sensor including the color separation element array, and an electronic device.

2. Description of the Related Art

In general, a color display device or a color image sensor displays a multicolor image or detects colors of incident light by using color filters. For example, a charge-coupled device (CCD) and a CMOS may be used as an image sensor. In the existing color display devices or color image sensors, a red, green and blue (RGB) color filter scheme in which, for example, green filters are disposed in two of four pixels and blue and red filters are disposed in the other two pixels is widely used. Alternatively, a cyan, yellow, green and magenta (CYGM) color filter scheme, in which filters of complementary colors, i.e., cyan, yellow, green, and magenta, are respectively disposed in four pixels, may be used.

However, the efficiency of using light of the color filters may be low since the color filters absorb all colors of light except for a filtered color. For example, since RGB color filters may transmit only about ⅓ of incident light and absorb the other ⅔ of the incident light, the efficiency of using the incident light of the RGB color filters may only be about 33%. Therefore, most of the optical loss of the color filters of the color displays or the color image sensors is caused by the color filters.

After an image is obtained using a color filter in a color mosaic manner, an original color image may be obtained through an image processing. Although such a color filter is widely used in a color image sensor, since the color filter mostly absorbs light except for a specific wavelength band as described above, the efficiency of using light may be low.

SUMMARY

One or more exemplary embodiments provide color separation element arrays having increased color separation efficiency.

One or more exemplary embodiments provide image sensors including color separation element arrays having increased color separation efficiency.

One or more exemplary embodiments provide electronic devices including color separation element arrays having increased color separation efficiency.

Additional aspects will be set forth in part in the description which follows and, in part, will be apparent from the description, or may be learned by practice of the exemplary embodiments.

According to an aspect of an exemplary embodiment, there is provided a color separation element array including: a transparent layer; and a plurality of color separation elements provided in the transparent layer and configured to separate an incident light into a color light according to wavelength bands, wherein the plurality of color separation elements include a first element having a first refractive index and a second element arranged in one side of the first element in a horizontal direction and having a second refractive index.

A width ratio of the first element and the second element may be configured to change according to an incidence angle of the incident light.

The first element and the second element may be arranged in the horizontal direction with respect to the color separation element array.

A width ratio of the first element and the second element may increase as an incidence angle of the incident light increases.

A width difference between the first element and the second element may increase as an incidence angle of the incident light increases.

The transparent layer may be partitioned into pixel units, and the color separation element may be disposed in different locations in a pixel according to an incidence angle of the incident light.

The plurality of color separation elements may further include a third element having the second refractive index in another side of the first element.

The color separation element array may include a plurality of zones having different light incidence angles, and a width ratio of the first element, the second element, and the third element may be differently configured for each of the plurality of zones.

Among the second element and the third element, an element present in a light incidence direction may have smaller width than width of other element.

A width ratio of the first element, the second element, and the third element may gradually change toward an edge of the color separation element array from a center thereof.

The color separation element array may include a plurality of zones, and a width ratio of the first element, the second element, and the third element may be differently configured for each of the plurality of zones.

The first refractive index may be greater than the second refractive index.

A refractive index of the transparent layer may be less than the first refractive index and the second refractive index.

A layout of the first element, the second element, and the third element may have a symmetrical structure about a center of the color separation element array.

The plurality of color separation elements may be spaced apart from a lower surface of the transparent layer, and a width ratio of the first element, the second element, and the third element may depend on a spaced distance of the plurality of color separation elements.

One surface of the plurality of color separation elements may be exposed to an outside of the transparent layer.

The plurality of color separation elements may include a color separation element having the second element of which a width is 0.

According to an aspect of another exemplary embodiment, there is provided an image sensor including: a light sensor array in which a plurality of light sensors configured to sense light and convert the light into an electrical signal may be arranged in pixel units; a transparent layer; and a plurality of color separation elements provided in the transparent layer and configured to separate an incident light into a color light according to wavelength bands, wherein the plurality of color separation elements include a first element having a first refractive index and a second element arranged in one side of the first element in a horizontal direction and having a second refractive index.

According to an aspect of another exemplary embodiment, there is provided an electronic device including: an object lens; a color separation element array; and a light sensor array in which a plurality of light sensors configured to sense light that transmits through the color separation element array and convert the light into an electrical signal may be arranged in pixel units, wherein the color separation element array may include a transparent layer, and a plurality of color separation elements provided in the transparent layer and configured to separate an incident light into a color light according to wavelength bands, and wherein the plurality of color separation elements may include a first element having a first refractive index and a second element arranged in one side of the first elements in a horizontal direction and having a second refractive index.

BRIEF DESCRIPTION OF THE DRAWINGS

The above and/or other aspects will become apparent and more readily appreciated from the following description of exemplary embodiments, taken in conjunction with the accompanying drawings in which.

DETAILED DESCRIPTION

Figure 1:
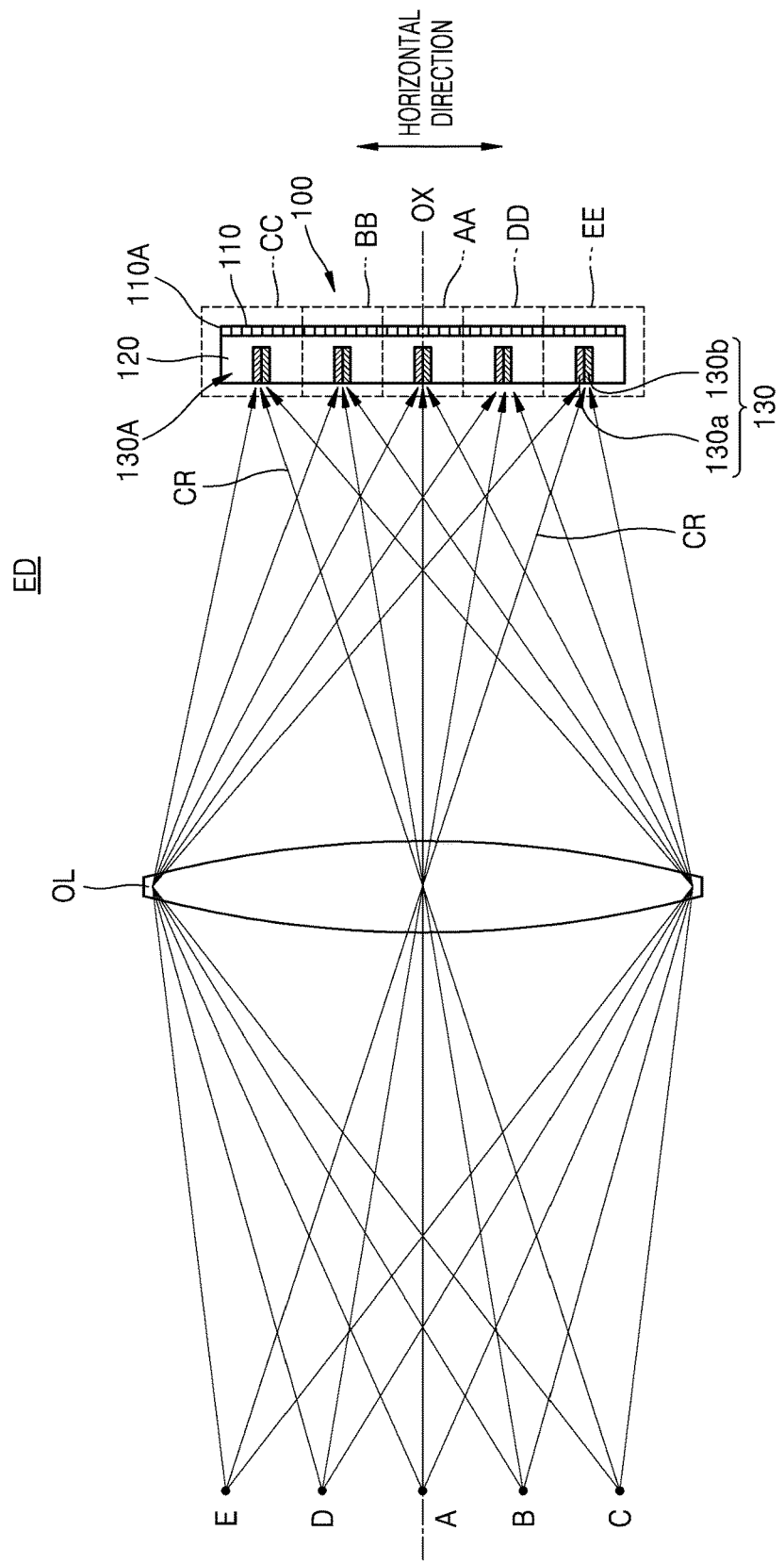
FIG. 1 is a schematic view of an electronic device according to an exemplary embodiment.

Exemplary embodiments will be described in detail with reference to the accompanying drawings. In the drawings, like reference numbers refer to like elements, and the thicknesses of layers and regions and the sizes of elements may be exaggerated for clarity. Exemplary embodiments described herein are for illustrative purposes only, and various modifications may be made therefrom. Accordingly, the exemplary embodiments are merely described below, by referring to the figures, to explain aspects. In the following description, when an element is referred to as being "above" or "on" another element in a layered structure, it may be directly on the other element while making contact with the other element or may be above the other element without making contact with the other element.

FIG. 1 is a schematic view of an electronic device ED according to an exemplary embodiment. Referring to FIG. 1, the electronic device ED according to an exemplary embodiment may include an object lens OL and an image sensor 100 which converts light focused by the object lens OL into an electric image signal. The image sensor 100 may include a light sensor array 110A including a plurality of light sensors 110 which senses light and a color separation element array 130A which includes a plurality of color separation elements 130. The plurality of color separation elements 130 may be provided in a transparent layer 120. For example, some of the plurality of color separation elements 130 may be exposed to the outside of the transparent layer 120, but are not limited thereto. For example, the plurality of color separation elements 130 may be buried in the transparent layer 120. The transparent layer 120 may include material having a light transmission characteristic. For example, the transparent layer 120 may include material having a low refractive index and a low light absorption. For example, the transparent layer 120 may include a transparent dielectric substance.

The object lens OL may focus an image of a subject on the image sensor 100. If the image sensor 100 is located on a focal plane of the object lens OL, light starting from a point of the subject may be focused at a point on the image sensor 100 again through the object lens OL. For example, light starting from a point A on an optical axis OX may pass through the object lens OL and then may be focused at a center of the image sensor 100 on the optical axis OX. Light starting from a point B, C, D, or E apart from the optical axis OX may cross the optical axis OX by the object lens OL and then may be focused at a point of the periphery of the image sensor 100. For example, light starting from the point D above the optical axis OX may cross the optical axis OX and then may be focused at a lower edge of the image sensor 100, and light starting from the point C below the optical axis OX may cross the optical axis OX and then may be focused at an upper edge of the image sensor 100. The light starting from the point D between the optical axis OX and the point E may be focused between the center of the image sensor 100 and the lower edge thereof.

Therefore, the light starting from the different points A, B, C, D, and E may be incident to the image sensor 100 at different angles according to distances between the points A, B, C, D, and E and the optical axis OX. An incidence angle of the light incident to the image sensor 100 may be usually defined as a chief ray angle (CRA). A chief ray may mean a ray incident to the image sensor 100 through a center of the object lens OL from a point of the subject. The CRA may mean an angle formed by the chief ray and the optical axis OX. For example, the light starting from the point A on the optical axis OX may have a CRA of 0 degrees and may be vertically incident to a region AA of the image sensor 100. The farther the start point is from the optical axis OX, the greater the CRA.

In view of the image sensor 100, a CRA of the light incident to the region AA of the image sensor 100 may be 0 degrees, and the closer to the edge of the image sensor 100, the greater the CRA of the incident angle. For example, a CRA of light starting from the points C and E and incident to regions CC and EE of an outermost edge of the image sensor 100 may be the greatest. A CRA of light starting from the points B and D and incident to regions BB and DD between the center and the edge of the image sensor 100 may be less than the CRA of the light incident to the regions CC and EE and greater than 0 degrees. Here, the CRA may be used as an incidence angle. The incidence angle may be an angle formed by a perpendicular line with respect to an incidence surface and a ray. The CRA will be referred to as the incidence angle below.

The color separation elements 130 may generally have a structure having directionality. Although such a directionality efficiently works on light vertically incident to the color separation elements 130, if the incidence angle increases more than a certain angle, the color separation efficiency of the color separation elements 130 may deteriorate. Thus, if the color separation elements 130 having the same structure are arranged in an entire region of the image sensor 100, an image quality may deteriorate the farther the color separation elements 130 are arranged from the center of the image sensor 100.

The color separation element array 130A according to the exemplary embodiment may include a plurality of color separation elements 130 configured to make efficient color separation possible at the edge of the image sensor 100.

The plurality of color separation elements 130 may be disposed at a light incidence side of the light sensor array 110A to separate the incident light according to wavelengths. The plurality of color separation elements 130 may separate colors by changing a light travel path according to wavelengths of the incident light using a light diffraction or refraction characteristic that varies depending on wavelengths. For example, the plurality of color separation elements 130 may have various shapes such as a bar shape having a transparent symmetrical or asymmetrical structure or a prism shape having an inclined surface. Shapes of the plurality of color separation elements 130 may be variously designed according to desired spectrum distributions of exit light.

The light sensor 110 may be provided, for example, in a pixel unit. A pixel may have a unit for sensing light according to wavelengths and electrically processing light quantity. For convenience of description, the plurality of color separation elements 130 are exaggerated in size in FIG. 1. Relative locations and sizes of the light sensor 110 and the plurality of color separation elements 130 may not be exactly matched.

The plurality of color separation elements 130 may be used to increase efficiency of light using by separating spectrum distributions of light incident to the light sensor 110 in accordance with corresponding pixels. The plurality of color separation elements 130 may have a structure in which a plurality of elements having different refractive indices are arranged in a horizontal direction. In this regard, the horizontal direction may be a width direction in the view of a user when the user uses the electronic device ED. The color separation elements 130 may include, for example, a first element 130a having a first refractive index and a second element 130b having a second refractive index. For example, the second refractive index of the second element 130b may be less than the first refractive index of the first element 130a. A refractive index of the transparent layer 120 may be less than the first and second refractive indices of the first element 130a and the second element 130b. Locations of the first element 130a and the second element 130b may be changed according to a direction of incident light. A width ratio of the first element 130a and the second element 130b may be differently configured according to the incidence angle of the incident light. A relative location relationship of pixels of the image sensor 100 and the color separation elements 130 may be variously changed according to color separation characteristics of the color separation elements 130.

Figure 2:
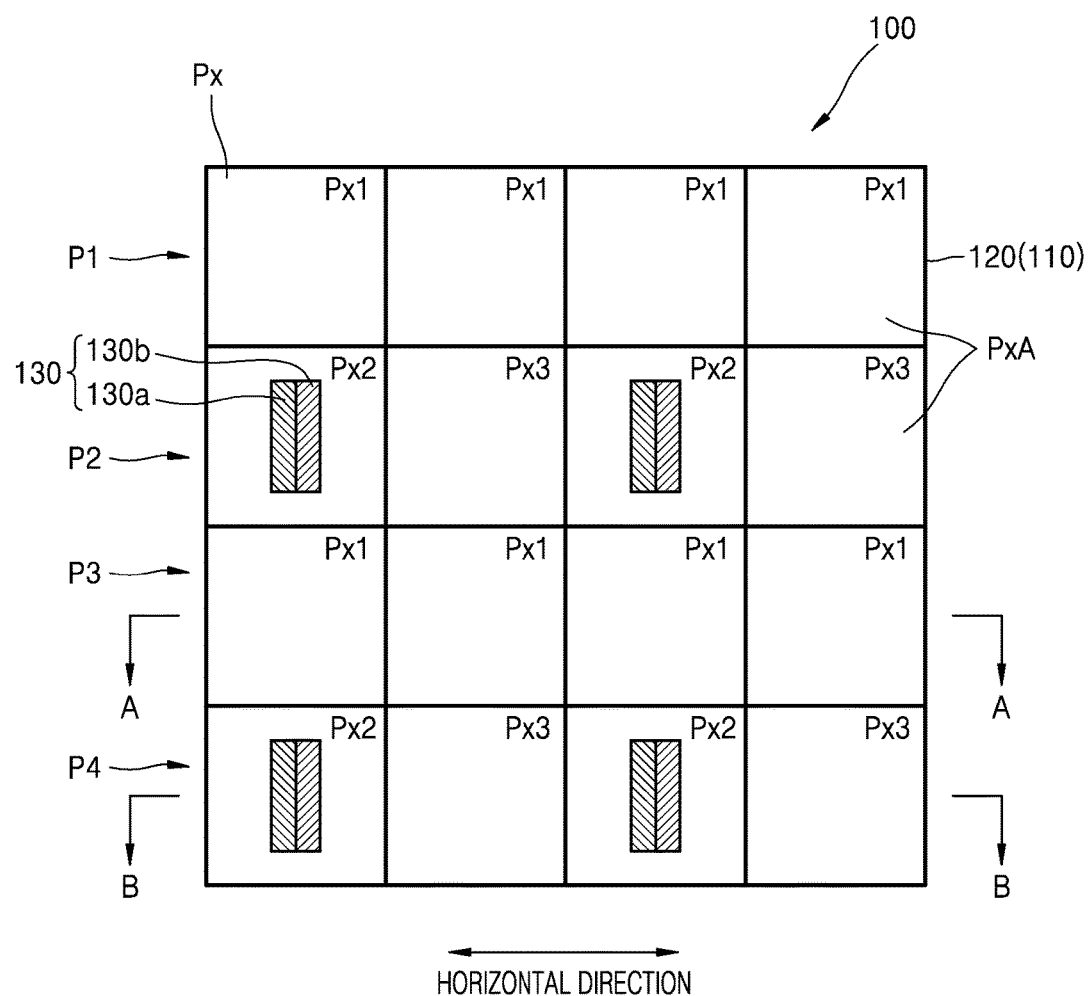
FIG. 2 is a schematic view of an image sensor according to an exemplary embodiment.

FIG. 2 is a schematic view of a location relationship of pixels Px of the image sensor 100 and the color separation elements 130. Referring to FIG. 2, the image sensor 100 may include a plurality of pixel arrays PxA arranged in a two-dimensional (2D) matrix having a plurality of rows and a plurality of columns. The pixel arrays PxA may include a plurality of pixel rows and a plurality of pixel columns. The plurality of pixel arrays PxA may include, for example, first pixels Px1 sensing a first wavelength light, second pixels Px2 sensing a second wavelength light, and third pixels Px3 sensing a third wavelength light.

For example, as shown in FIG. 2, the pixel arrays PxA may include first through fourth pixel rows P1, P2, P3, and P4. The first pixels Px1 may be arranged in the first pixel row P1. The second pixels Px2 and the third pixels Px3 may be alternately arranged in the second pixel row P2. The first pixels Px1 may be arranged in the third pixel row P3. The second pixels Px2 and the third pixels Px3 may be alternately arranged in the fourth pixel row P4. Only four pixel rows are illustrated in FIG. 2 but more pixel rows may be arranged in the same manner as described above. The color separation elements 130 may be provided in some pixels.

Figure 3:
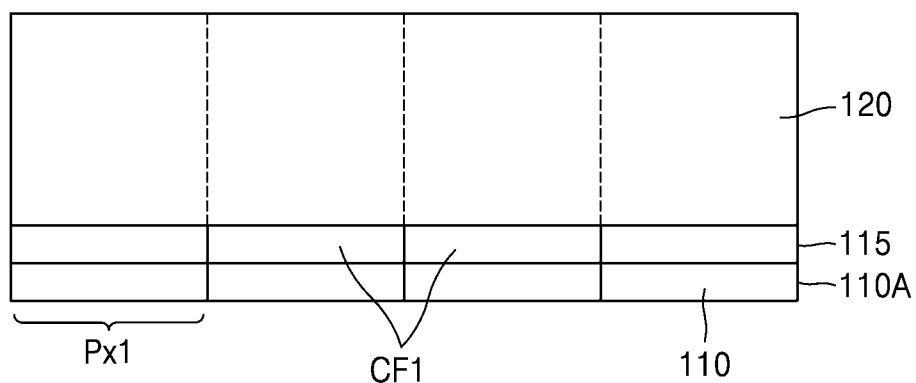
FIG. 3 is a cross-sectional view of a line A-A of FIG. 2.

FIG. 3 is a cross-sectional view of a line A-A of FIG. 2. The transparent layer 120 may be provided in the light sensor array 110A. No color separation elements may be provided in the transparent layer 120 corresponding to the first pixels Px1. Light of all wavelength bands may transmit through the transparent layer 120 in which no color separation element is provided.

Figure 4:
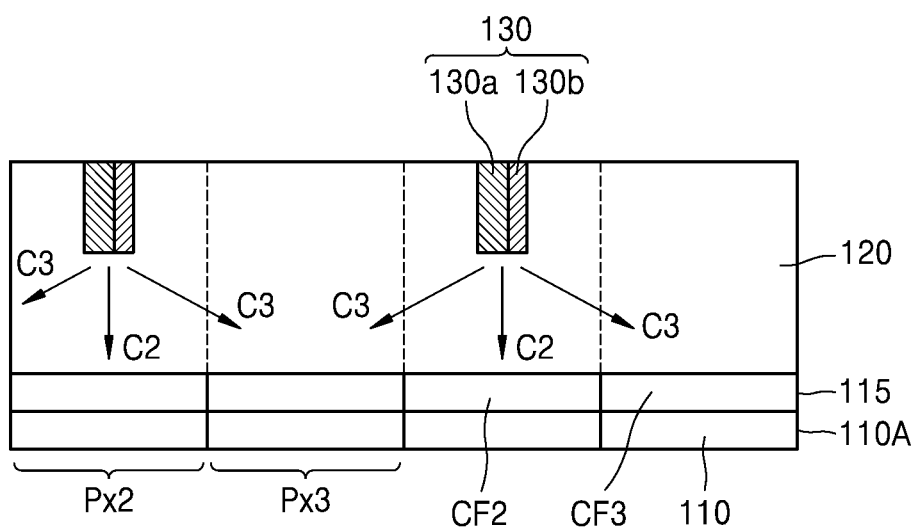
FIG. 4 is a cross-sectional view of a line B-B of FIG. 2.

FIG. 4 is a cross-sectional view of a line B-B of FIG. 2. The transparent layer 120 may be provided in the light sensor array 110A. The color separation elements 130 may be provided in the transparent layer 120 corresponding to the second pixels Px2 of the light sensor array 110A. No color separation elements may be provided in the transparent layer 120 corresponding to the third pixels Px3. However, the color separation elements 130 may be provided in a location corresponding to the third pixels Px3 according to a light incidence angle. The color separation elements 130 may include, for example, the first element 130a having a first refractive index and the second element 130b having a second refractive index.

Referring to FIGS. 3 and 4, a color filter 115 may be further provided between the light sensor array 110A and the transparent layer 120. The color filter 115 may include, for example, a first color filter CF1 transmitting light (or a first color light) of a first wavelength band, a second color filter CF2 transmitting light (or a second color light) of a second wavelength band, and a third color filter CF3 transmitting light (or a third color light) of a third wavelength band.

In such a structure, light may be separated into light C2 of the second wavelength band and light C3 of the third wavelength band by the color separation elements 130. The color separation elements 130 may be designed, for example, such that among the incident light, the light C2 of the second wavelength band transmits without changing a travel direction thereof and the light C3 of the third wavelength band transmits by changing a travel direction thereof at both sides with an incline. Then, the light C2 of the second wavelength band may transmit through the color separation elements 130 and may be incident to the light sensor 110 of the second pixels Px2 directly below the color separation elements 130, whereas the light C3 of the third wavelength band may transmit through the color separation elements 130 and may be incident to the light sensor 110 of the third pixels Px3 at both sides of the second pixels Px2.

In an example shown in FIGS. 2 through 4, about 33% of the incident light may transmit through the color filter 115 in the first pixels Px1 and may reach the light sensor 110, whereas since a rate of colors corresponding to the second and third color filters CF2 and CF3 of the second pixels Px2 is high in the second and third color filters CF2 and CF3, light transmittance may increase. Thus, the efficiency of light using in the second pixels Px2 and the third pixels Px3 may increase. For example, the first wavelength band may be green, the second wavelength band may be blue, and the third wavelength band may be red. That is, the first pixels Px1 may be green pixels, the second pixels Px2 may be blue pixels, and the third pixels Px3 may be red pixels. In this case, the efficiency of blue and red light may increase.

Figure 5:
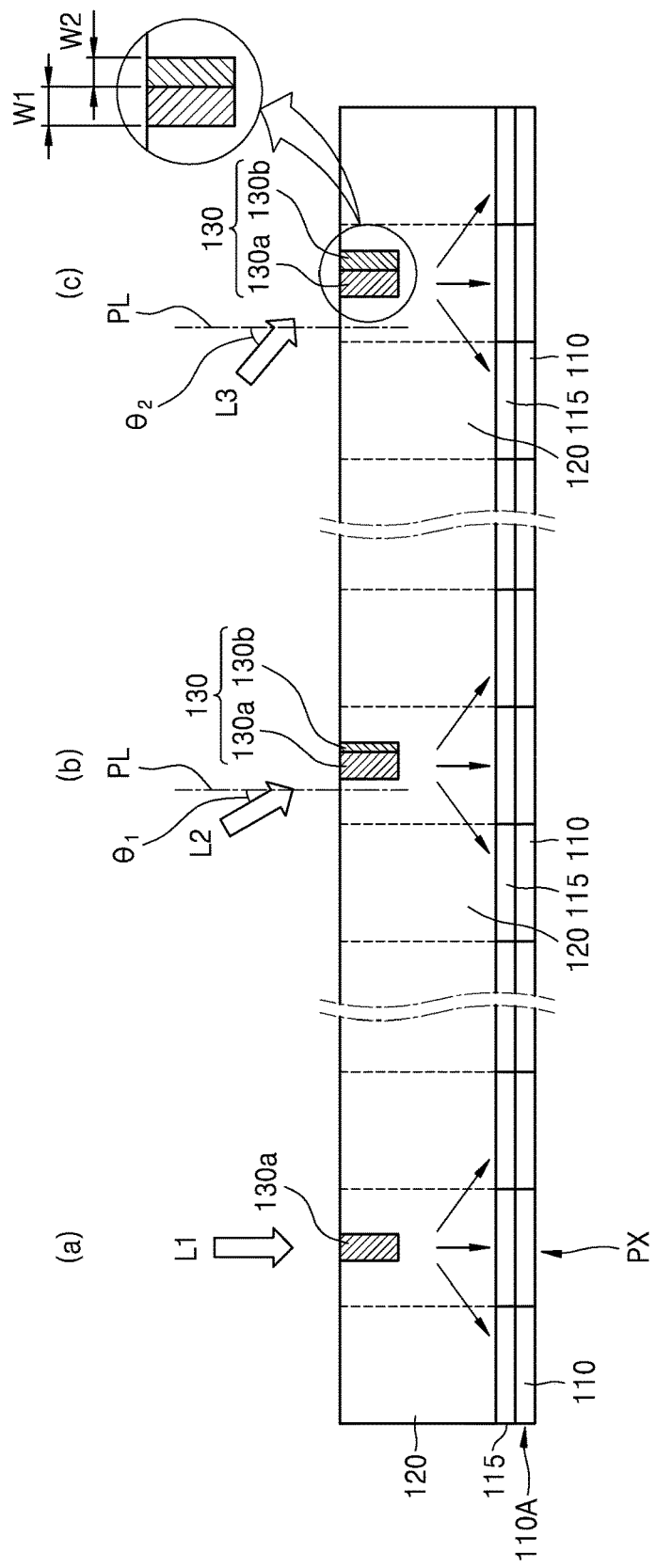
FIG. 5 illustrates an example of a color separation element array of an image sensor according to an exemplary embodiment.

FIG. 5 illustrates an example of an array configuration of the color separation elements 130 of an image sensor with respect to an angle of incident light according to an exemplary embodiment. In FIG. 5, (a) is a case in which first light L1 is vertically incident to the transparent layer 120. In (a), the color separation elements 130 may include only the first element 130a. The first element 130a may be provided in the transparent layer 120 corresponding to a pixel Px of the image sensor 110. In FIG. 5, (b) is a case in which second light L2 is incident to the transparent layer 120 at an incline. In (b), an incidence angle of the second light L2 is θ1, and may be an angle formed by a perpendicular line PL with respect to the transparent layer 120 and a travel direction of the second light L2. In (a), an incidence angle of the first light L1 is 0. In (c), an incidence angle of third light L3 is θ2. In (c), the third light L3 may have the incidence angle θ2 and may be incident to the transparent layer 120 at an incline. In this regard, θ1<θ2. In FIG. 5, (a), (b), and (c) may indicate a transparent layer part and an image sensor part that are in a region in which a light incidence angle sequentially increases. Referring to FIGS. 1 and 5, for example, the region AA may correspond to (a), a region BB may correspond to (b), and a region CC may correspond to (c). If a first refractive index of the first element 130a is less than a second refractive index of the second element 130b, the second element 130b may be disposed relatively farther from a light incidence direction than the first element 130a.

A width ratio of the first element 130a and the second element 130b may be differently configured according to a light incidence angle. For example, the first element 130a and the second element 130b may be arranged in a horizontal direction with respect to the color separation element array 130A. The width ratio of the first element 130a and the second element 130b may be a width in the horizontal direction. A width of the first element 130a is W1. A width of the second element 130b is W2. For example, the width ratio of the first element 130a and the second element 130b may increase as the light incidence angle increases. A width ratio of the second element 130b with respect to the first element 130a may be W2/W1. When the width W1 of the first element 130a is uniform, the width W2 of the second element 130b may increase as the light incidence angle increases. However, the width W1 of the first element 130a and the width W2 of the second element 130b may vary in the same way. The color separation elements 130 may be configured such that the width W2 of the second element 130b is 0.

Meanwhile, FIG. 5 shows the example in which a relative location of the first element 130a does not change in a region corresponding to each pixel. For example, the first element 130a may be located in a center of the region corresponding to each pixel. The width W2 of the second element 130b may be changed according to a region that is to be partitioned according to the light incidence angle.

Figure 6:
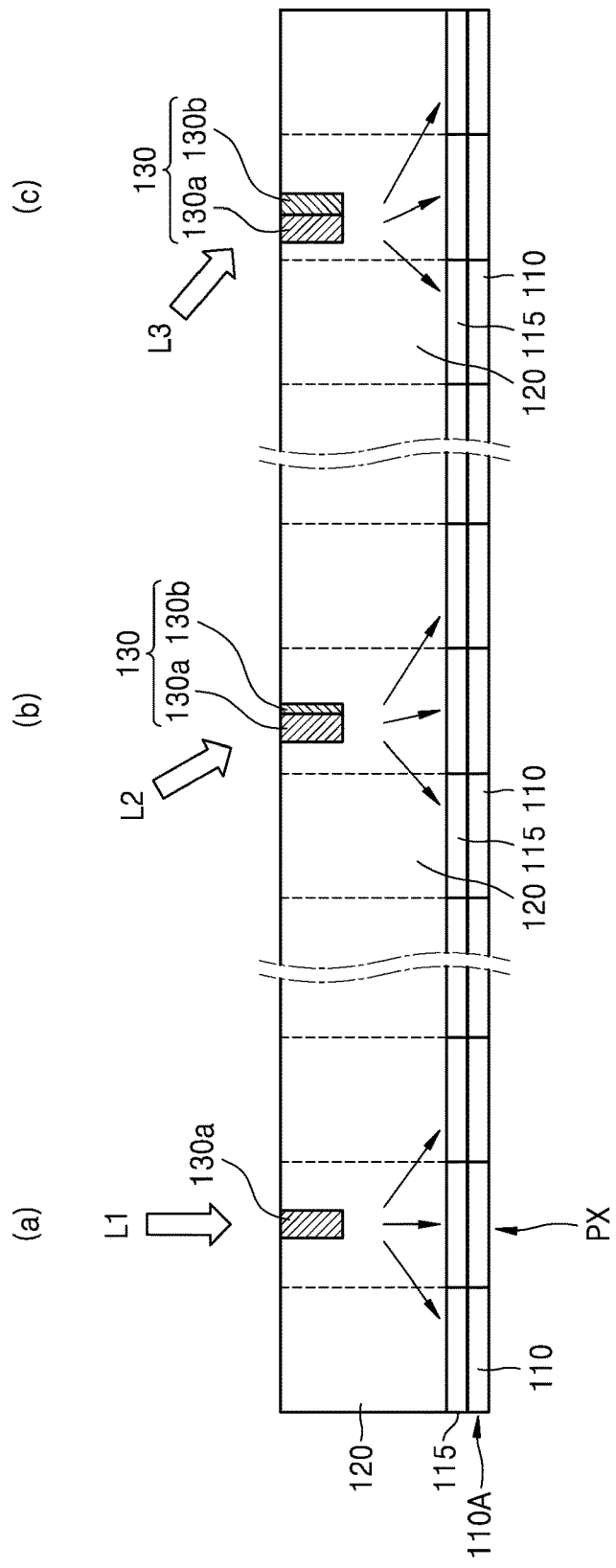
FIG. 6 illustrates another example of a color separation element array of an image sensor according to an exemplary embodiment.

Alternatively, the relative location of the first element 130a may change in the region corresponding to each pixel. This example is shown in FIG. 6. Referring to FIG. 6, the first element 130a may have different locations in (a), (b), and (c) according to pixels. For example, the first element 130a may be further shifted in a light incidence direction. The width ratio of the first element 130a and the second element 130b may be different according to location shift of the first element 130a.

Figure 7:
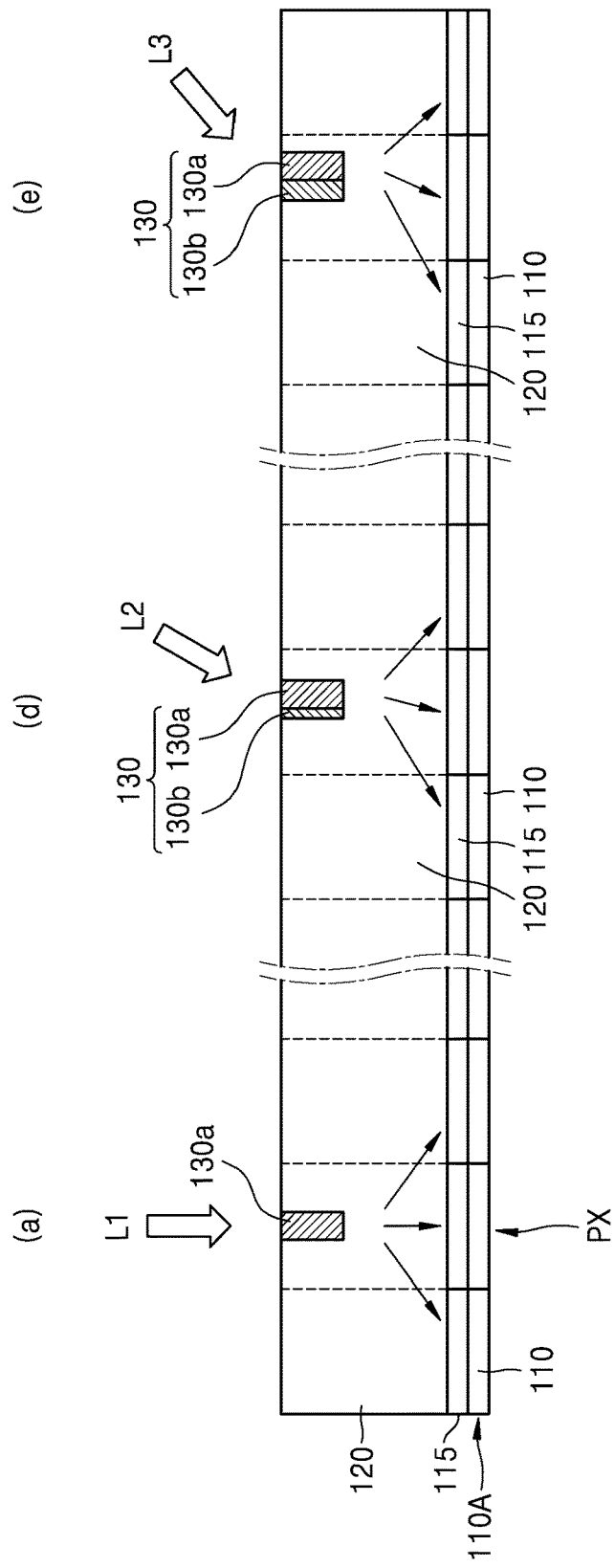
FIG. 7 illustrates another example of a color separation element array of an image sensor according to an exemplary embodiment.

FIG. 7 shows an example in which light is incident from the right of a color separation element array. Referring to FIGS. 1 and 7, for example, the region AA may correspond to (a), a region DD may correspond to (d), and a region EE may correspond to (e). In FIG. 7, (a), (d), and (e) are examples of regions in which a light incidence angle sequentially increases. A width ratio of the first element 130a and the second element 130b may be changed according to the light incidence angle. As the light incidence angle increases, a ratio of a width of the second element 130b with respect to a width of the first element 130a may increase. The second element 130b may be disposed relatively farther from a light incidence direction than the first element 130a. The first element 130a may have different locations according to pixels. For example, as the light incidence angle increases, the first element 130a may be shifted in the light incidence direction.

Figure 8:
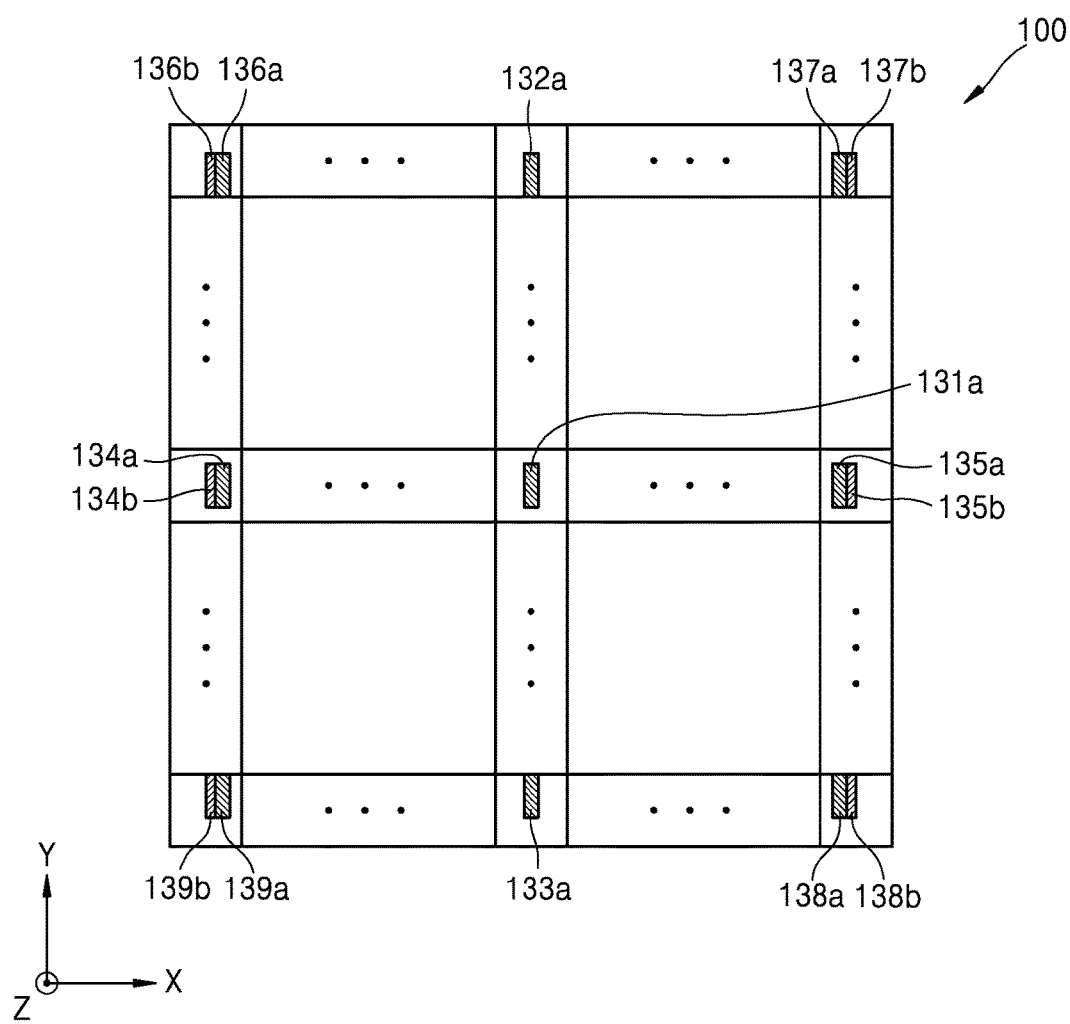
FIG. 8 is a plan view of an image sensor according to an exemplary embodiment.

FIG. 8 is a plan view of the image sensor 100 illustrating a layout of first and second color separation elements with respect to locations of a plurality of color separation elements. Referring to FIG. 8, first color separation elements 131a, 132a, and 133a of color separation elements may be provided in a center of the image sensor 100. However, this is merely an example. A combination structure of first and second color separation elements may be provided in the center of the image sensor 100.

First color separation elements 132a, 133a, 134a, 135a, 136a, 137a, 138a, and 139a and second color separation elements 134b, 135b, 136b, 137b, 138b, and 139b of color separation elements located in a periphery of the image sensor 100 may be disposed in different locations according to pixels. Width ratios of the first color separation elements 132a, 133a, 134a, 135a, 136a, 137a, 138a, and 139a and the second color separation elements 134b, 135b, 136b, 137b, 138b, and 139b may be different according to pixels. In FIG. 8, an X direction may be a width direction of the first color separation elements 132a, 133a, 134a, 135a, 136a, 137a, 138a, and 139a and the second color separation elements 134b, 135b, 136b, 137b, 138b, and 139b. In FIG. 8, a Z-axis may be the same direction as the optical axis OX, and the layout of the first color separation elements 132a, 133a, 134a, 135a, 136a, 137a, 138a, and 139a and the second color separation elements 134b, 135b, 136b, 137b, 138b, and 139b may be symmetrical with respect to a Y axis.

For example, the first color separation elements 132a, 136a, and 137a and the second color separation elements 136b and 137b that are located in an upper region of the image sensor 100 may be shifted in a −Y direction, and the first color separation elements 133a, 138a, and 139a and the second elements 138b and 139b that are located in a lower region of the image sensor 100 may be shifted in a +Y direction. The first color separation elements 134a, 136a, and 139a and the second color separation elements 134b, 136b, and 139b that are located in a left of the image sensor 100 may be shifted in a +X direction. The first color separation elements 135a, 137a, and 138a and the second color separation elements 135b, 137b, and 138b that are located in a right of the image sensor 100 may be shifted in the −X direction.

The first color separation elements 132a, 133a, 134a, 135a, 136a, 137a, 138a, and 139a and the second color separation elements 134b, 135b, 136b, 137b, 138b, and 139b may be symmetrically shifted in relation to a center region. For example, the first color separation elements 131a, 132a, 133a, 134a, 135a, 136a, 137a, 138a, and 139a and the second color separation elements 134b, 135b, 136b, 137b, 138b, and 139b of the color separation elements may be arranged in correspondence to a direction in which a CRA that passed through the object lens OL travels in the transparent layer 120. Width ratios of the first color separation elements 131a, 132a, 133a, 134a, 135a, 136a, 137a, 138a, and 139a and the second color separation elements 134b, 135b, 136b, 137b, 138b, and 139b of the color separation elements may be differently configured according to a light incidence angle.

For example, relative locations of the first color separation elements 131a, 132a, 133a, 134a, 135a, 136a, 137a, 138a, and 139a and the second color separation elements 134b, 135b, 136b, 137b, 138b, and 139b of the color separation elements in each pixel may be changed to an X direction. Alternatively, relative locations of the first color separation elements 131a, 132a, 133a, 134a, 135a, 136a, 137a, 138a, and 139a and the second color separation elements 134b, 135b, 136b, 137b, 138b, and 139b of the color separation elements in each pixel may be changed to the X direction and a Y direction. Width ratios of the first color separation elements 131a, 132a, 133a, 134a, 135a, 136a, 137a, 138a, and 139a and the second color separation elements 134b, 135b, 136b, 137b, 138b, and 139b may be different according to a location change.

Figure 9:
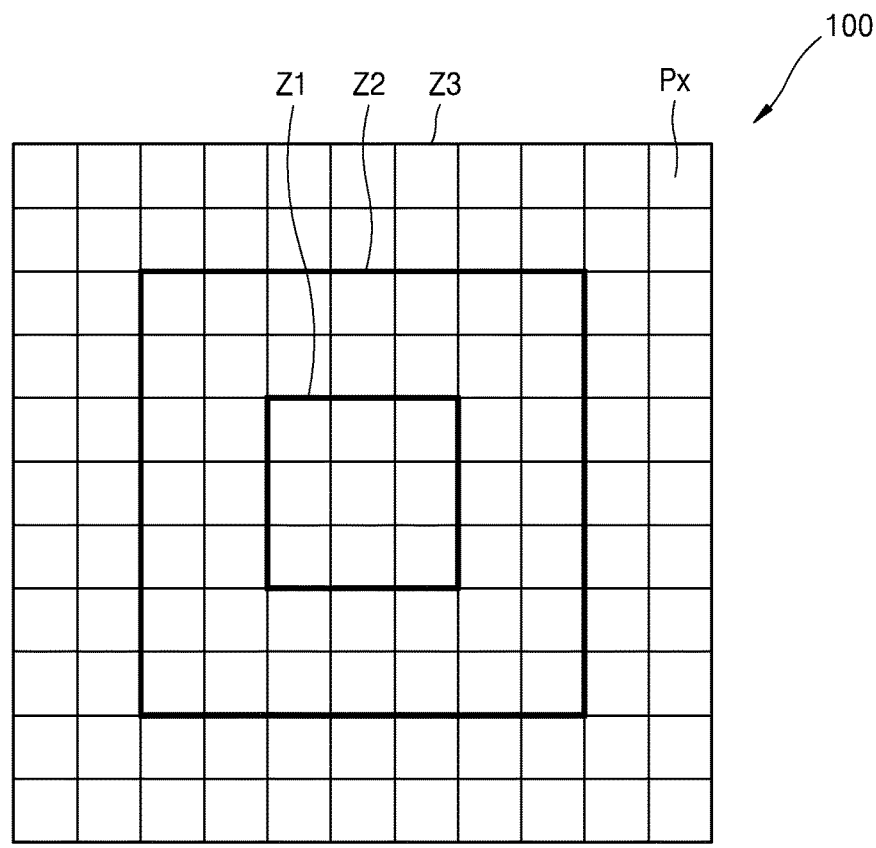
FIG. 9 illustrates an example of an image sensor split into a plurality of zones in which color separation elements are respectively arranged according to an exemplary embodiment.

FIG. 9 illustrates an example of the image sensor 100 split into a plurality of zones. For example, the image sensor 100 may include a first zone Z1 that is a center region, a second zone Z2 around the first zone Z1, and a third zone Z3 around the second zone Z2. Px may denote a pixel. A width ratio of first and second color separation elements of the color separation elements may be configured in the same way for each zone. Although the width ratio of first and second color separation elements may be differently configured for each pixel, the width ratio of first and second color separation elements is configured in the same way for each zone, thereby making a manufacture design easier. For example, the color separation elements may include only first color separation elements in the first zone Z1. The width ratio of first and second color separation elements of the color separation elements may be, for example, ⅓ in the second zone Z2. However, these configurations are merely examples. The width ratio of first and second color separation elements of the color separation elements may be, for example, ⅔ in the third zone Z3. However, these configurations are merely examples. The width ratio of first and second color separation elements may be variously configured according to the number of zones and for each zone. The width ratio of first and second color separation elements may be greater in a zone farther from the center region of the image sensor 100. The image sensor 100 may split into concentric circle zones or concentric rectangular zones. Alternatively, the image sensor 100 may variously split into zones in a vertical direction or in a horizontal direction.

Figure 10:
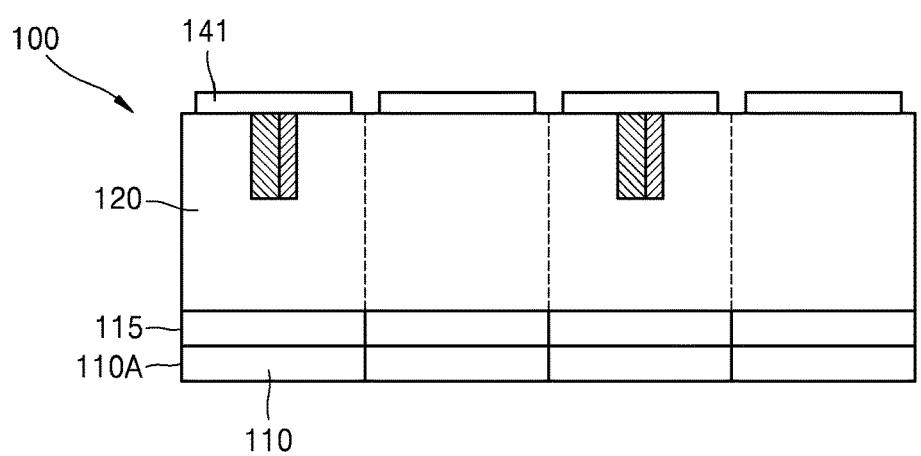
FIG. 10 illustrates an example of an image sensor of FIG. 4 further including a micro lens.

FIG. 10 illustrates an example of the image sensor 100 of FIG. 4 further including a micro lens 141. The micro lens 141 may be focused on the light sensor array 110A through the transparent layer 120.

Figure 11:
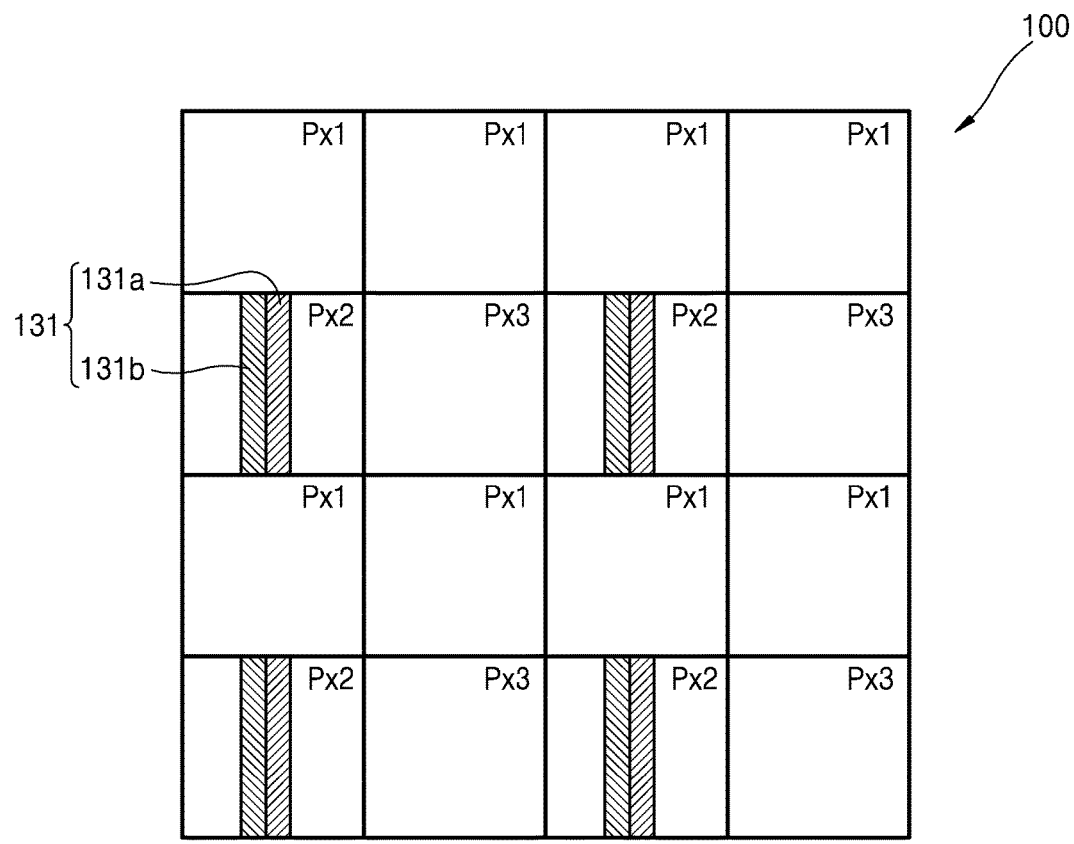
FIG. 11 illustrates an example of the image sensor of FIG. 2 in which a length of a color separation element is changed.

FIG. 11 illustrates another example of a location relationship of the first, second, and third pixels Px1, Px2, and Px3 and color separation elements 131 of the image sensor 100. By comparing FIG. 11 with FIG. 2, the elements are substantially the same except for locations of the color separation elements 131, and thus detailed descriptions of the elements are omitted. The color separation elements 131 may include, for example, the first color separation elements 131a and the second color separation elements 131b. The first color separation elements 131a and the second color separation elements 131b may be disposed, for example, in an entire length of the second pixels Px2 in a vertical direction. By comparing FIG. 11 with FIG. 2, FIG. 2 shows an example in which the first elements 130a and the second elements 130b are arranged in a partial length of the second pixels Px2 in a vertical direction. Depending on the case, the first color separation elements 131a and the second color separation elements 131b may be arranged beyond the entire length of the second pixels Px2 in the vertical direction.

Figure 12:
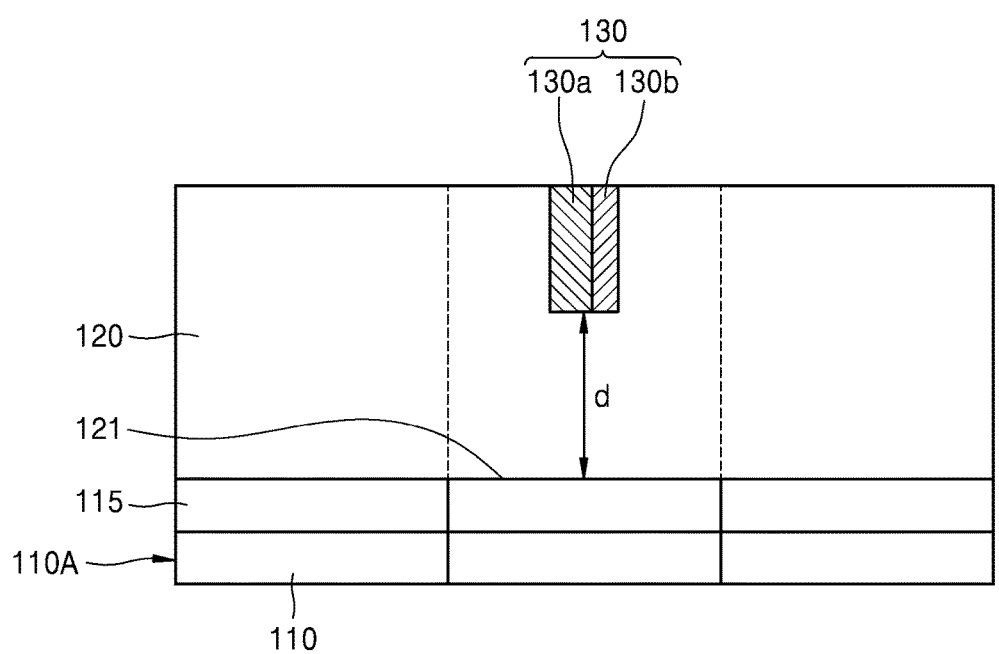
FIG. 12 illustrates an example of an image sensor in which a thickness of a color separation element is changed according to an exemplary embodiment.

Referring to FIG. 12, the color separation elements 130 may be spaced apart from a lower surface 121 of the transparent layer 120. One surface of the color separation elements 130 may be exposed to an upper portion of the transparent layer 120. However, the color separation elements 130 are not limited thereto. The color separation elements 130 may be buried in the transparent layer 120. A width ratio of the first element 130a and the second element 130b may be different based on a spaced distance d between a lower surface of the color separation elements 130 and the lower surface 121 of the transparent layer 120. For example, the shorter the spaced distance d, the smaller the width ratio of the first element 130a and the second element 130b.

As described above, color separation elements having different refractive indices may differently adjust width ratios of the color separation elements according to a region of an image sensor, thereby increasing color separation efficiency. Light efficiency may be reduced toward an edge of the image sensor rather than a center region thereof, and thus light efficiency may be supplemented for each region according to a structure of the color separation element, thereby generally increasing light efficiency uniformly.

Figure 13:
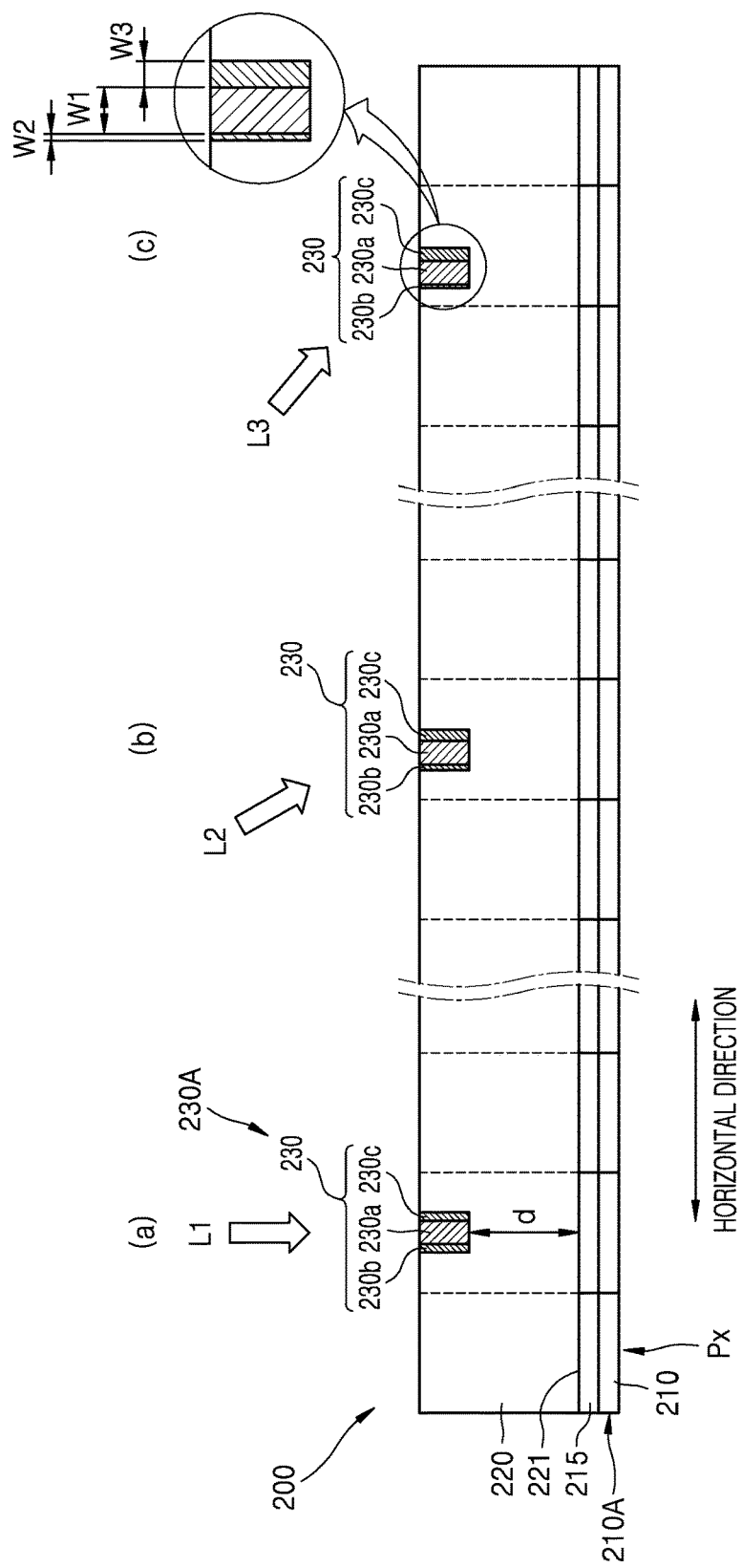
FIG. 13 illustrates a color separation element array of an image sensor according to another exemplary embodiment.

FIG. 13 illustrates an image sensor 200 according to another exemplary embodiment.

The image sensor 200 may include a light sensor array 210A including a plurality of light sensors 210 sensing light and a color separation element array 230A including a transparent layer 220 and a plurality of color separation elements 230. A color filter 215 may be further provided between the light sensor array 210A and the transparent layer 220. For example, the light sensor 210 and the color filter 215 may be provided in the pixel Px unit.

The plurality of color separation elements 230 may be provided in the transparent layer 220 or may be provided in the pixels Px requiring color separation. For example, the plurality of color separation elements 230 may be disposed in the transparent layer 220. For example, some of the plurality of color separation elements 230 may be exposed to the outside of the transparent layer 220, but are not limited thereto. For example, the plurality of color separation elements 230 may be buried in the transparent layer 220.

In FIG. 13, the image sensor 200 splits into regions according to light incidence angles. For example, the first light L1 may be incident at a first incidence angle with respect to the transparent layer 220, the second light L2 may be incident at a second incidence angle with respect to the transparent layer 220, and the third light L3 may be incident at a third incidence angle with respect to the transparent layer 220. For example, the first light L1 may be vertically incident to the transparent layer 220, and the first incidence angle may be 0 degrees. The second incidence angle may be less than the third incidence angle. For example, the first light L1 may be incident to a center region of the image sensor 200 (or the transparent layer 220), the third light L3 may be incident to an edge region of the image sensor 200 (or the transparent layer 220), and the second light L2 may be incident between the center region and the edge region of the image sensor 200 (or the transparent layer 220). As compared with FIG. 1, the center region, the edge region, and a region therebetween may respectively correspond to the regions AA, CC, and BB.

The color separation elements 230 may include, for example, first elements 230a, second elements 230b disposed in one lateral direction of the first elements 230a, and third elements 230c disposed in another lateral direction of the first elements 230a. In this regard, a lateral direction may be a horizontal direction of the image sensor 200, and the horizontal direction may be a width direction in the view of a user when the user uses an electronic device employing the image sensor 200.

The first elements 230a, the second elements 230b, and the third elements 230c may have different refractive indices. For example, the second elements 230b and the third elements 230c may have smaller refractive indices than that of the first elements 230a. Alternatively, the second elements 230b and the third elements 230c may have the same refractive index that is less than the refractive indices of the first elements 230a. The transparent layer 220 may have, for example, a refractive index less than those of the first elements 230a, the second elements 230b, and the third elements 230c.

The first elements 230a, the second elements 230b, and the third elements 230c may have different width ratios according to regions to which light is incident with different incidence angles. For example, the first elements 230a may have a uniform width, and a width ratio of the second elements 230b and the third elements 230c may be differently configured according to light incidence angles. When a width of the first elements 230a is W1, a width of the second elements 230b is W2, and a width of the third elements 230c is W3, the width ratio of the second elements 230b and the third elements 230c may be W2/W3. The greater the light incidence angle, the greater the W2/W3. Alternatively, the second elements 230b and the third elements 230c may be configured such that a difference between W2 and W3 greatly increases as the light incidence angle increases.

However, the first elements 230a, the second elements 230b, and the third elements 230c are not limited thereto. The width W1 of the first elements 230a may be changed. For example, W1:W2:W3 may be differently configured. W1:W2:W3 may be variously changed according to color separation efficiency and light efficiency with respect to the light incidence angle. As described above, the color separation efficiency and light efficiency may be adjusted by changing a width ratio of the three elements 230a, 230b, and 230c of the color separation elements 230 in the exemplary embodiment.

The color separation elements 230 may be disposed in different locations of each pixel Px according to the light incidence angle. For example, the color separation elements 230 may be shifted closer to a light incidence direction as the light incidence angle increases. For example, when light is incident from a left upper part in FIG. 13, the color separation elements 230 may be gradually shifted to the left in the pixel Px. A width of an element of the color separation elements 230 relatively far away from the light incidence direction may be configured to gradually increase as the light incidence angle increases. A width of an element of the color separation elements 230 relatively closer to the light incidence direction may be configured to be gradually reduced as the light incidence angle increases.

In FIG. 13, the third element 230c may be relatively far away from the light incidence direction, and the width thereof may gradually increase as the light incidence angle increases. A width of the second element 230b may be gradually reduced as the light incidence angle increases. The width ratio of the first through third elements 230a, 230b, and 230c may be different according to locations thereof in the pixel Px. The width ratio of the first through third elements 230a, 230b, and 230c may be different according to the spaced distance d between the color separation elements 230 and a lower surface 221 of the transparent layer 220 because color separation efficiency and light efficiency may be different according to the locations of the first through third elements 230a, 230b, and 230c in the pixel Px or the spaced distance d.

As described above, color separation elements having different refractive indices may differently adjust width ratios of the color separation elements according to a region of an image sensor, thereby increasing color separation efficiency.

Figure 14:
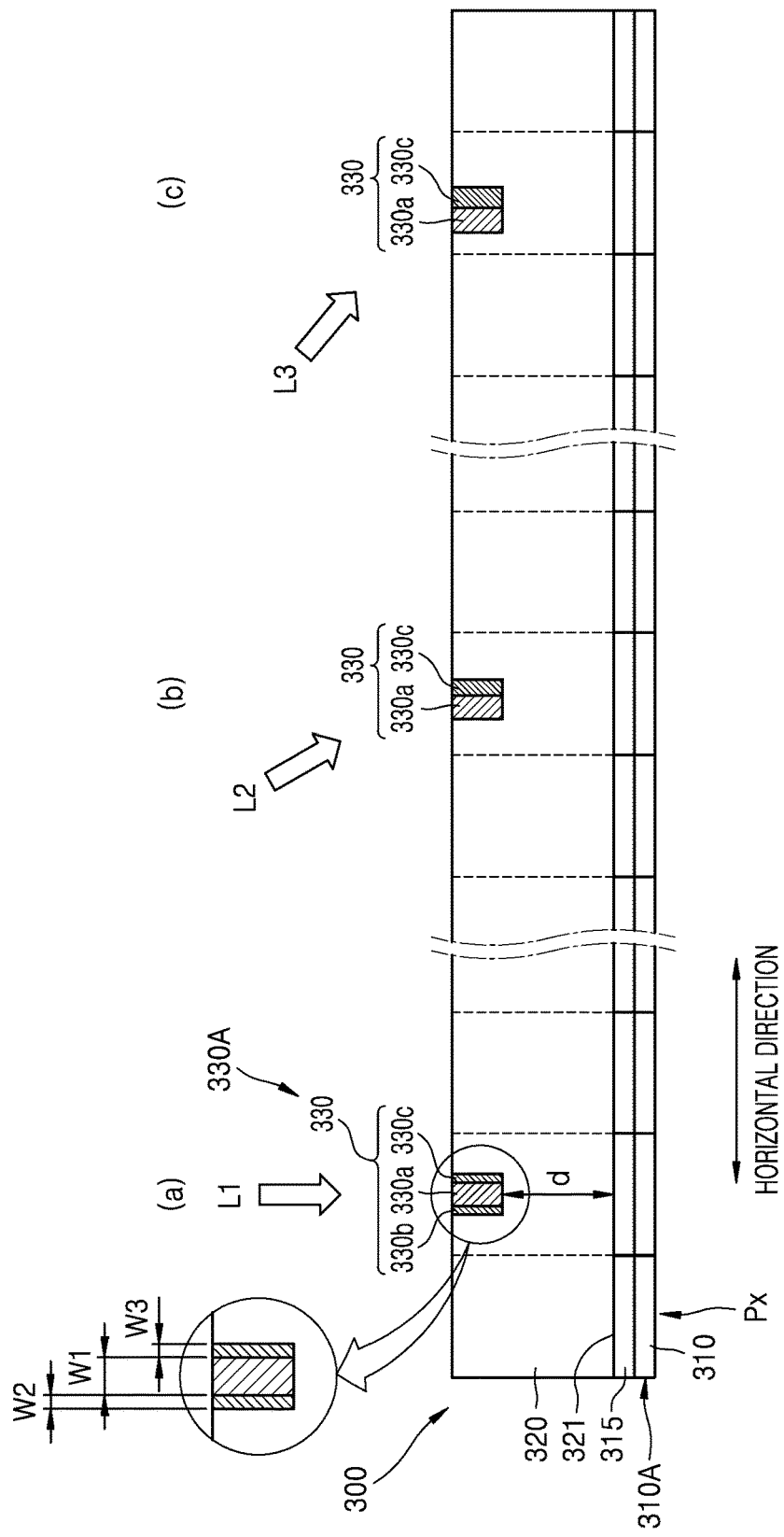
FIG. 14 illustrates a color separation element array of an image sensor according to another exemplary embodiment.

FIG. 14 illustrates an image sensor 300 according to another exemplary embodiment.

The image sensor 300 may include a light sensor array 310A including a plurality of light sensors 310 sensing light and a color separation element array 330A including a transparent layer 320 and a plurality of color separation elements 330. A color filter 315 may be further provided between the light sensor array 310A and the transparent layer 320. The light sensor 310 and the color filter 315 may be provided in the pixel Px unit. The plurality of color separation elements 330 may be provided in the transparent layer 320 or may be provided in the pixels Px requiring color separation. For example, the plurality of color separation elements 330 may be disposed in the transparent layer 320. For example, some of the plurality of color separation elements 330 may be exposed to the outside of the transparent layer 320, but are not limited thereto. For example, the plurality of color separation elements 330 may be buried in the transparent layer 320.

In FIG. 14, the image sensor 300 splits into regions according to light incidence angles. For example, the first light L1 may be incident at a first incidence angle with respect to the transparent layer 320, the second light L2 may be incident at a second incidence angle with respect to the transparent layer 320, and the third light L3 may be incident at a third incidence angle with respect to the transparent layer 320. For example, the first light L1 may be vertically incident to the transparent layer 320, and the first incidence angle may be 0 degrees. The second incidence angle may be less than the third incidence angle. For example, the first light L1 may be incident to a center region of the transparent layer 320, the third light L3 may be incident to an edge region of the transparent layer 320, and the second light L2 may be incident between the center region and the edge region of the transparent layer 320. As compared with FIG. 1, the center region, the edge region, and a region therebetween may respectively correspond to the regions AA, CC, and BB.

The color separation element 330 may include, for example, first elements 330a, second elements 330b disposed in one lateral direction of the first elements 330a, and third elements 330c disposed in another lateral direction of the first elements 330a. In this regard, a lateral direction may be a horizontal direction of the image sensor 300, and the horizontal direction may be a width direction in the view of a user when the user uses an electronic device employing the image sensor 300.

The first elements 330a, the second elements 330b, and the third elements 330c may have different refractive indices. For example, the second elements 330b and the third elements 330c may have smaller refractive indices than that of the first elements 330a. Alternatively, the second elements 330b and the third elements 330c may have the same refractive index that is less than the refractive indices of the first elements 330a. The transparent layer 320 may have, for example, a refractive index less than those of the first elements 330a, the second elements 330b, and the third elements 330c.

The first elements 330a, the second elements 330b, and the third elements 330c may have different incidence angles and may have different width ratios according to regions to which light is incident. For example, a region in which light is vertically incident (a region in which the light L1 is incident) may include the first elements 330a, the second elements 330b, and the third elements 330c, and other regions may include the first elements 330a and the third elements 330c. For example, the width W2 of the second elements 330b may be 0 according to the light incidence angle. A width ratio of the first elements 330a and the third elements 330c may be differently configured according to light incidence angles. When a width of the first elements 330a is W1, a width of the second elements 330b is W2, and a width of the third elements 330c is W3, the width ratio of the first elements 330a and the third elements 330c may be W3/W1. The greater the light incidence angle, the greater the width ratio W3/W1. Meanwhile, the color separation element 330 may be disposed in different locations of each pixel Px according to the light incidence angle in the exemplary embodiment. For example, the color separation element 330 may be shifted closer to a light incidence direction as the light incidence angle increases. For example, when light is incident from a left upper part in FIG. 14, the color separation element 330 may be gradually shifted to the left in the pixel Px. A width of an element of the color separation element 330 relatively far away from the light incidence direction may be configured to gradually increase as the light incidence angle increases. In FIG. 14, the third element 330c may be relatively far away from the light incidence direction, and the width thereof may gradually increase as the light incidence angle increases. The width ratio of the first through third elements 330a, 330b, and 330c may be different according to locations thereof in the pixel Px. The width ratio of the first through third elements 330a, 330b, and 330c may be different according to the spaced distance d between the color separation element 330 and a lower surface 321 of the transparent layer 320 because color separation efficiency and light efficiency may be different according to the locations of the first through third elements 330a, 330b, and 330c in the pixel Px or the spaced distance d. In consideration of various conditions, the width ratio of the first through third elements 330a, 330b, and 330c may be differently configured for each pixel, thereby increasing color separation efficiency and light efficiency. A color separation element array according to an exemplary embodiment may be easily manufactured since a plurality of elements are integrally arranged in a horizontal direction.

Although a few exemplary embodiments have been shown and described, it would be appreciated by those skilled in the art that changes may be made in exemplary embodiments without departing from the principles and spirit of the disclosure, the scope of which is defined in the claims and their equivalents.

What is claimed is:

1. A color separation element array comprising:
a transparent layer; and
a plurality of color separation elements provided in the transparent layer and configured to separate an incident light into a color light according to wavelength bands,
wherein the plurality of color separation elements comprise a first element having a first refractive index and a second element arranged in one side of the first element in a horizontal direction and having a second refractive index.

2. The color separation element array of claim 1, wherein the first element and the second element are arranged in the horizontal direction with respect to the color separation element array.

3. The color separation element array of claim 1, wherein the first refractive index is greater than the second refractive index.

4. The color separation element array of claim 1, wherein a refractive index of the transparent layer is less than the first refractive index and the second refractive index.

5. The color separation element array of claim 1, wherein one surface of the plurality of color separation elements is exposed to an outside of the transparent layer.

6. An image sensor comprising:
a light sensor array in which a plurality of light sensors configured to sense light and convert the light into an electrical signal are arranged in pixel units;
a transparent layer; and
a plurality of color separation elements provided in the transparent layer and configured to separate an incident light into a color light according to wavelength bands,
wherein the plurality of color separation elements comprise a first element having a first refractive index and a second element arranged in one side of the first element in a horizontal direction and having a second refractive index.

7. The image sensor of claim 6, wherein the first element and the second element are arranged in the horizontal direction with respect to a color separation element array.

8. The image sensor of claim 6, wherein the first refractive index is greater than the second refractive index.

9. The image sensor of claim 6, wherein a refractive index of the transparent layer is less than the first refractive index and the second refractive index.

10. The image sensor of claim 6, wherein one surface of the plurality of color separation elements is exposed to an outside of the transparent layer.

11. The image sensor of claim 6, further comprising a color filter between the light sensor array and the transparent layer.

12. The image sensor of claim 6, wherein pixels comprise green pixels, blue pixels, and red pixels, and the plurality of color separation elements are provided in the blue pixels to separate the incident light into blue light and red light.

\* \* \* \* \*